United States Patent [19]

Schillke et al.

[11] 4,383,494
[45] May 17, 1983

[54] SOLDER-COATING APPARATUS

[75] Inventors: Peter Schillke; Robert R. Walls, both of Santa Barbara, Calif.

[73] Assignee: Allied Corporation, Morris Township, Morris County, N.J.

[21] Appl. No.: 236,006

[22] Filed: Feb. 19, 1981

Related U.S. Application Data

[62] Division of Ser. No. 93,215, Nov. 13, 1979, Pat. No. 4,277,518.

[51] Int. Cl.³ .................. B05C 3/132; B05C 11/06
[52] U.S. Cl. .............................. 118/50; 118/63; 118/74; 118/66; 118/69; 118/423
[58] Field of Search ............. 118/423, 74, 63, 429, 118/50, 66, 423, 69; 228/36, 37, 40

[56] References Cited

U.S. PATENT DOCUMENTS

| | | | |
|---|---|---|---|
| 1,011,280 | 12/1911 | Trout et al. | 118/428 X |
| 1,898,005 | 2/1933 | Drescher | 118/423 X |
| 1,979,758 | 11/1934 | Merritt | 118/324 |
| 2,176,093 | 10/1939 | Merrill | 118/63 X |
| 4,072,777 | 2/1978 | Schoenthaler | 118/63 X |
| 4,101,066 | 7/1978 | Corsaro et al. | 228/37 X |
| 4,184,449 | 1/1980 | Louderback | 118/423 X |

Primary Examiner—John P. McIntosh
Attorney, Agent, or Firm—Arthur J. Plantamura; Jay P. Friedenson

[57] ABSTRACT

A continuous process for applying a solder coating to copper-coated holes and tracks on a printed circuit board. The upper surface of the circuit board having a flux thereon is contacted with a contact member and the circuit board and contact member are moved through a molten bath of solder. Solder is displaced by the circuit board to produce a buoyant force which presses the circuit board against the contact member. The speed of the contact member in moving through the molten solder is controlled to determine dwell time of the circuit board and maintain contact between the circuit board and the contact member.

An apparatus for continuously applying a solder coating to copper-coated holes and tracks on a printed circuit board. The apparatus includes means to contain a bath of molten solder and means to contact the upper surface of a printed circuit board. Also, the apparatus includes means to move the contacted circuit board through the bath of molten solder as the displaced solder exerts an upward buoyant force against the circuit board.

15 Claims, 8 Drawing Figures

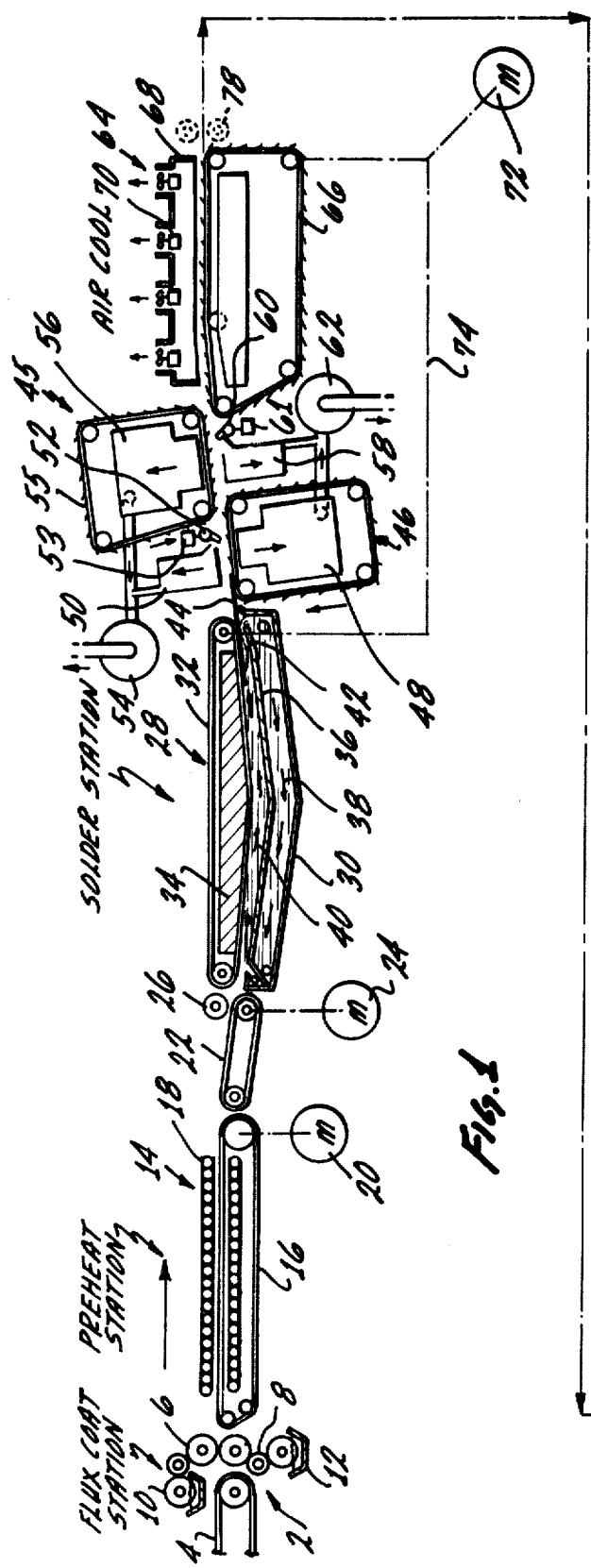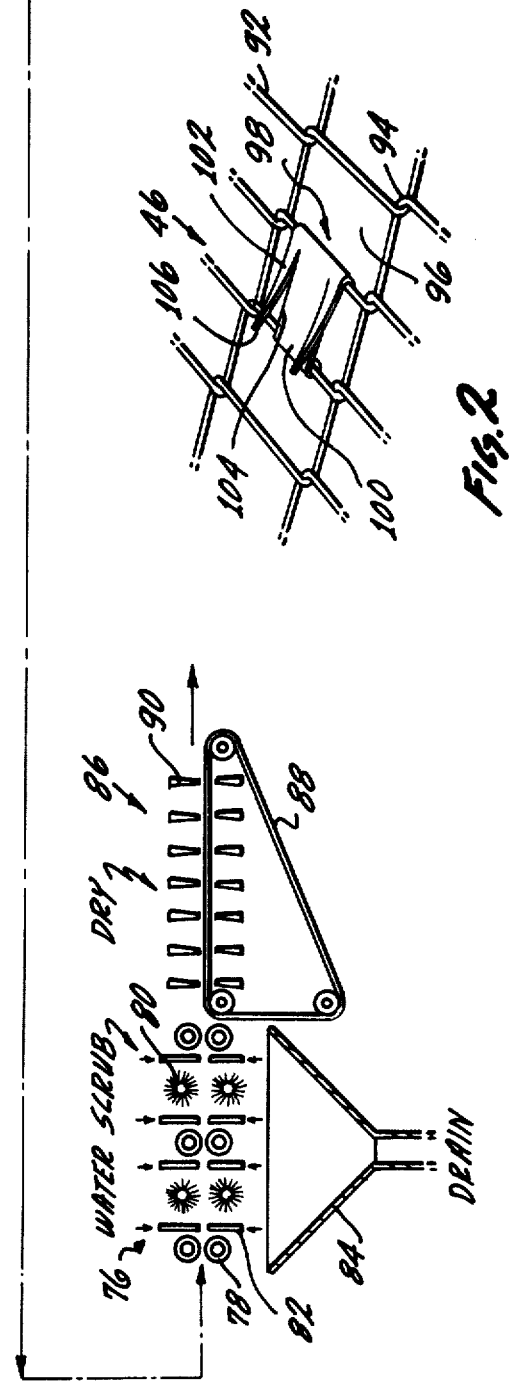

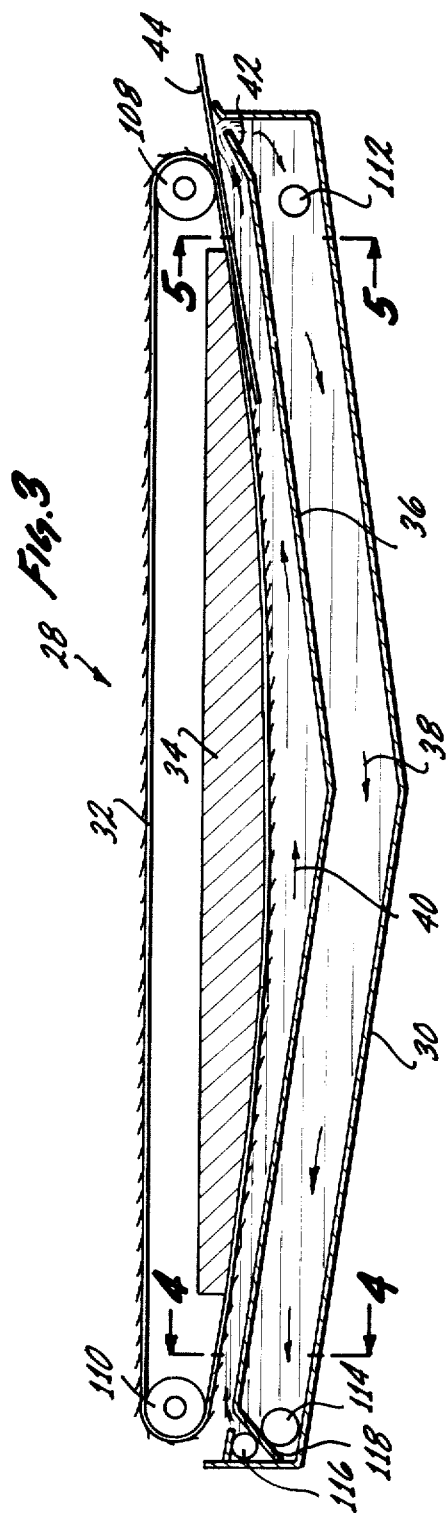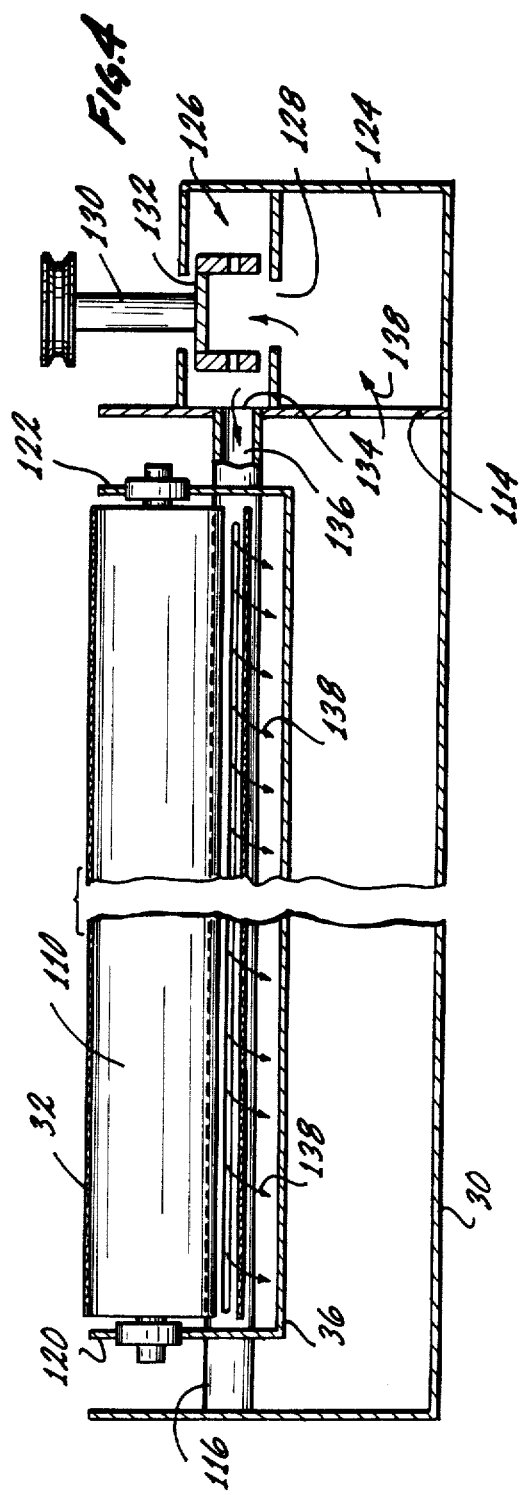

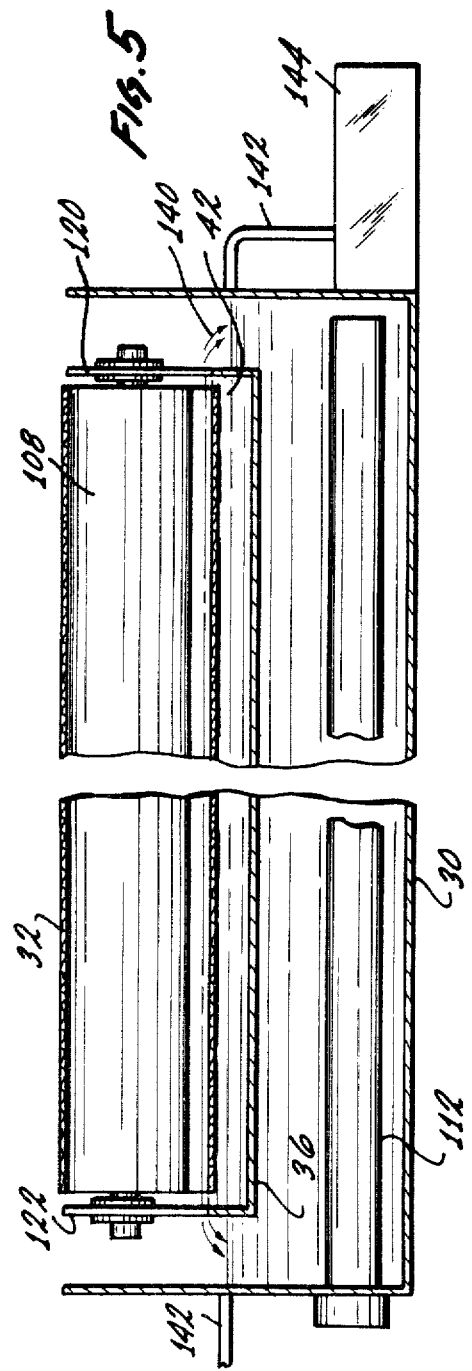
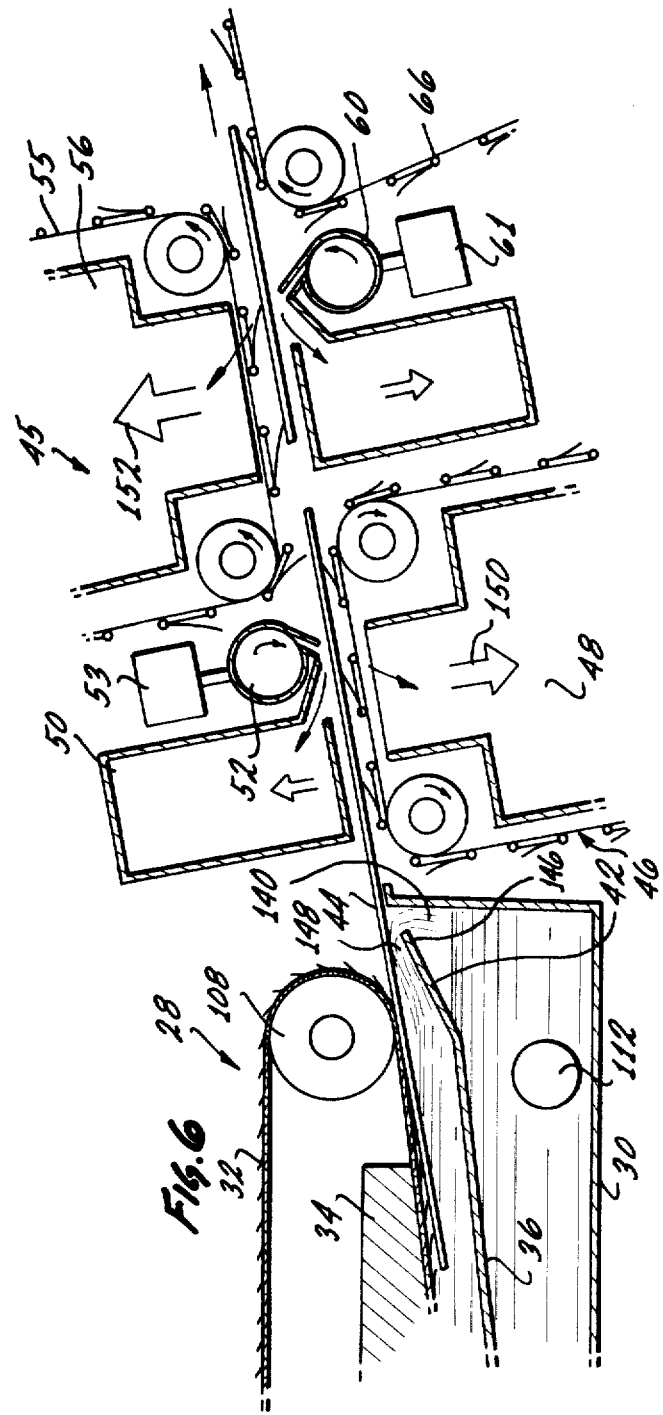

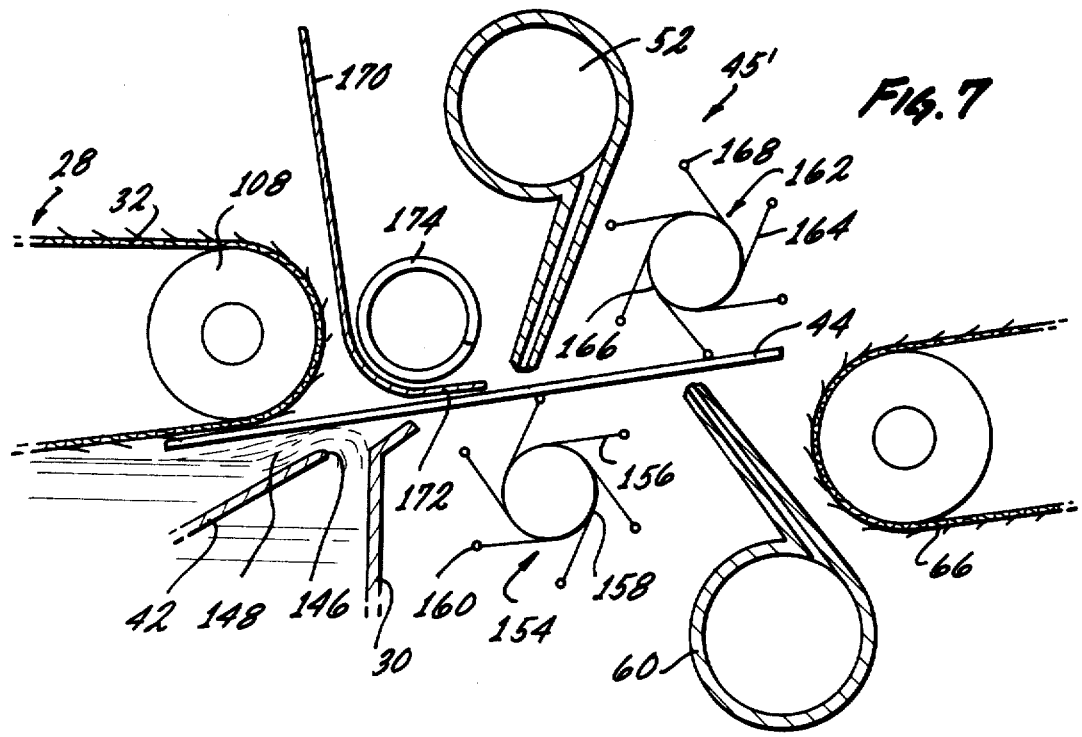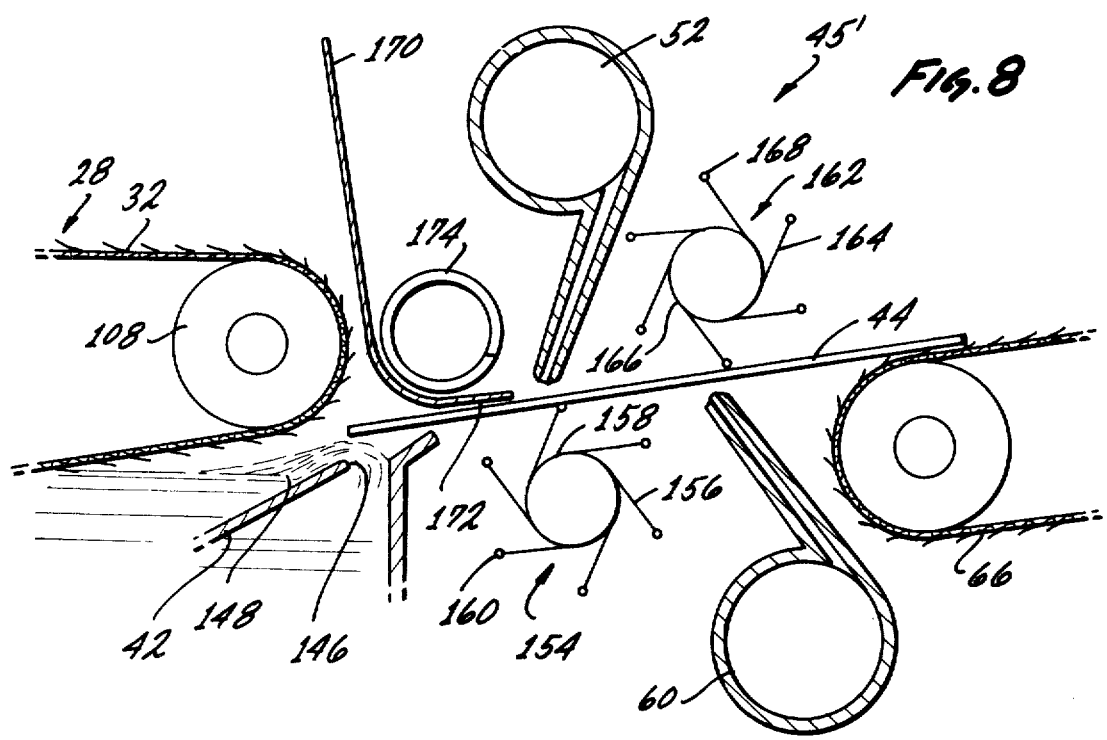

SOLDER-COATING APPARATUS

This is a division of application Ser. No. 093,215 filed Nov. 13, 1979, now U.S. Pat. No. 4,277,518.

BACKGROUND OF THE INVENTION

Printed circuit boards are well known and are widely used in forming complex circuits. A circuit board, to which other electrical components may be joined, includes conductive tracks formed on the surface of the board by copper coating and may also include holes extending through the board. The surfaces of the holes may also be copper coated such that components which are joined to the circuit board at the holes form an electrical connection with the copper coating on the hole surfaces. Circuit boards may, also, have conductive tracks formed on both the top and the bottom surface of the board with conductive holes passing through the board forming an electrical connection between the tracks on the top and the bottom surfaces.

After forming a circuit board through any procedure, it is desirable to protect the copper coating on the board from oxidation. One convenient means of protecting the copper coating is to coat the copper coating with solder. In addition to protecting the copper coating on the board, the solder provides for the connection of electrical components with the circuits defined by the copper coating on the surfaces of the board.

At present, there is no satisfactory procedure or apparatus for continuously applying a solder coating to the copper-coated surfaces of the circuit board. In machines which are presently in use, boards are sequentially moved from one work station to another in performing the steps required to form a solder coating on the copper-coated surfaces of the circuit board. While such machines may operate at a relatively high rate of speed, their operation cannot be termed continuous because there is a dwell time at each station where a work operation is carried out on the circuit board.

In coating a circuit board with solder, the board may be dipped into a molten bath of solder. This procedure is unsatisfactory because different portions of the circuit board which are to be coated with solder are not exposed to the solder bath for equal periods of time. Thus, the solder coating on the various portions of the board may be nonuniform. To illustrate, the portion of the circuit board which is first immersed in the molten solder will be the last portion to be removed from the molten solder. Conversely, the last portion of the circuit board to enter the molten solder bath will be the first portion of the board to be removed.

In view of the above-described problems, it would be desirable if a process and apparatus could be devised for continuously coating circuit boards with solder. Circuit boards could then be coated with solder without the loss of time which occurs at the various work stations in a batch-type operation. Also, it would be desirable if a process and apparatus could be devised in which circuit boards are more uniformly coated with solder. The various portions of the circuit board would then be exposed to molten solder for approximately equal periods of time. This would be an improvement over procedures in which a circuit board is dipped into a bath of molten solder with various portions of the circuit board being exposed to the molten solder for unequal periods of time.

SUMMARY OF THE INVENTION

As a solution to the aforementioned problems, the present invention provides a process and apparatus for continuously applying a solder coating to copper-coated tracks and holes of a circuit board. In accord with the present process, the upper surface of a printed circuit board having a flux coating thereon may be contacted by a contact member. The contact member and the printed circuit board in contact therewith may then be moved into and through a bath of molten solder. As this occurs, molten solder is displaced by the circuit board to produce a buoyant force which presses the board against the contact member. As the contact member is moved through the bath of molten solder, the speed of movement of the contact member is controlled to determine dwell time of the circuit board and maintain contact between the circuit board and the contact member. If desired, the flow of molten solder within the bath may be controlled to produce a flow of solder in the vicinity of the circuit board which moves in the same general direction as the movement of the circuit board through the molten bath. Also, an exposed metallic solder surface may be generated within the molten bath with the circuit board being moved through the exposed surface as the board is withdrawn from the molten bath.

After coating the circuit board with solder, excess solder may be removed from the circuit board by blowing a gas against the circuit board. As gas is blown against the board, the circuit board may be supported at spaced-apart contact points. A source of partial vacuum may be applied adjacent to the circuit board to assist in the collection of solder which is removed from the board. Also, the source of partial vacuum may be positioned to assist in the support of the circuit board as solder is removed by contact with the compressed gas.

As an alternative means of removing excess solder from the circuit board, the circuit board may be contacted by a rotatable support member having a plurality of outwardly extending contact members. The support member may then be rotated to bring the outwardly extending contact members into contact with the circuit board as the board moves past a source of compressed gas.

In addition to a process, the invention provides an apparatus for continuously coating a circuit board with solder. The apparatus may include means to contain a bath of molten solder and means to contact the upper surface of a circuit board. Also, the apparatus may include means to move the contacted circuit board through the bath of molten solder as the molten solder exerts an upward buoyant force against the circuit board.

The apparatus may also include means to produce a flow of solder in the vicinity of the circuit board which moves in the same general direction as the circuit board through the molten bath. This may be used to assist in maintaining contact between the circuit board and the means to contact the circuit board during movement of the circuit board through the molten solder.

Further, the apparatus may include means to generate an exposed metallic surface within the bath at the point where the circuit board is withdrawn from the molten bath. In this manner, a cleaner solder coating may be produced on the surface of the circuit board.

Also, the apparatus may include means to remove excess solder from the circuit board after removal of the circuit board from the bath of molten solder. The means to remove excess solder may include means to discharge a stream of compressed gas against the circuit board and means to move the circuit board past the stream of compressed gas. In moving the circuit board past the stream of compressed gas, means may be provided to contact the circuit board as spaced-apart contact points. Preferably, the means to contact the circuit board at spaced-apart contact points may include a conveyor having contact members thereon which define point contacts which are positioned to contact the circuit board at spaced-apart points.

Alternatively, the means to contact the circuit board as it moves past the stream of compressed gas may include a rotatable support member positioned to contact the circuit board with a plurality of contact members extending outwardly from the support member. The contact members may define spaced-apart contact points which may contact and support the circuit board as it moves past the stream of compressed gas.

In removing excess solder from the circuit boards, the apparatus may include means to apply a partial vacuum to collect excess solder which is removed. The means to apply a partial vacuum may also be positioned to provide a supporting force for the circuit board as it moves past the stream of compressed gas.

THE DRAWINGS

To further illustrate the invention in terms of a preferred embodiment thereof, reference is made to the enclosed drawings, in which:

FIG. 1 is a schematic flow diagram of a continuous process and apparatus for applying a solder coating to copper-coated surfaces of a printed circuit board;

FIG. 2 is a detail view of a conveyor having spaced-apart contact points thereon for contact with a printed circuit board to move the circuit board while reducing frictional contact between the board and the conveyor;

FIG. 3 is a longitudinal elevational view of a solder-coating station in which a conveyor is positioned to continuously move printed circuit boards through a bath of molten solder with the boards being coated with solder in a continuous operation and the various portions of the board being exposed to the molten solder for generally equal periods of time;

FIG. 4 is a sectional view taken along the line 4—4 of FIG. 3 to illustrate the manner in which the flow of molten solder within the solder bath may be controlled by pumping;

FIG. 5 is a sectional view taken along the line 5—5 of FIG. 3 to illustrate the manner in which the flow of molten solder may be directed over a weir to provide support for the circuit boards as they are removed from the solder bath and in which dross may be removed from the surface of the molten solder;

FIG. 6 is a sectional elevation illustrating the withdrawal of a printed circuit board from the molten bath of solder with the board being conveyed to a solder removal station where the surface of the board is swept with a stream of compressed air which is ejected from air knives;

FIG. 7 is a sectional elevation of an alternative means for removing excess solder from the coated circuit boards in which circuit boards are supported by drive members having a plurality of outwardly-extending arms that define contact points at the end of the arms which may contact the circuit boards, and FIG. 8 is an elevational view, similar to FIG. 7, illustrating the manner in which a circuit board is supported by the rotating drive members that supply contact points which may both support and move the circuit board past a stream of compressed air emitted by an air knife.

DETAILED DESCRIPTION

As shown schematically in FIG. 1, the process of the invention may be employed to apply a solder coating to the copper tracks of circuit boards in a continuous operation. The first work station is a flux coat station 2 where circuit boards arrive on a conveyor 4 and pass between coating rolls 6. The coating rolls 6 receive a conventional liquid flux from transfer rolls 8 which convey the flux from pickup rolls 10 that are partially immersed in flux within containers 12. The flux, which may be a typical acid flux for soldering copper, may be applied at room temperature. Also, if desired, the flux may be applied by another procedure, such as spraying.

On leaving the flux coating station 2, the circuit boards may enter a preheat station 14 where the flux is activated by heating to a board surface temperature such as about 150° to 200° F. At the preheat station 14, the circuit boards may be transported on a conveyor 16 through an oven 18. The speed of the conveyer 16 and the temperature of the oven 18 are controlled such that copper-coated holes and tracks on the circuit board reach the desired temperature almost simultaneously. The tracks are more accessible to heat than the holes in the circuit board. Thus, the heating rate at the preheat station 14 must not be too fast, or the tracks and the board could be damaged by excess heating in the time required to bring the holes to the desired temperature. As indicated, the speed of the conveyor 16 may be controlled by a motor 20.

After leaving preheat station 14, the circuit boards may be transported on a speed change conveyor 22 that is driven by a motor 24. It may be desirable, as described, to run the conveyor 16 at a relatively low speed in gradually heating the circuit boards at the preheat station 14. This may permit shortening the length of the oven 18 used to heat the circuit boards to a desired temperature to activate the flux coating. However, in subsequent operations, it may be desirable to move the circuit boards at a higher rate of speed to reduce the time duration in the solder bath. The speed change conveyor may, thus, serve to increase the speed of movement of the circuit boards after leaving the preheat station 14.

As indicated, the speed change conveyor 22 may be inclined downwardly at a slight angle toward the right such that the circuit boards pass beneath a guide roll 26 at a desired angle to enter a solder station 28. The solder station 28 employs a pan 30 which contains molten solder with a belt 32 continuously moving through the molten solder within the pan. The belt 32 may pass over a bed 34 whose lower surface has a generally arcuate configuration which defines an arcuate path for the belt as it moves through the solder. The belt 32 may be formed of stainless steel and have an open mesh configuration with the belt contacting the circuit boards without retaining solder within the open mesh of the belt. The arcuate path of movement of the belt 32 as it passes through the molten solder imparts an arcuate path of movement to circuit boards which are contacted by the belt. This is desirable since it tends to maintain the circuit boards in contact with the belt 32 while insuring that the circuit boards are completely immersed in the molten solder at the soldering station 28.

As indicated, a separator 36 may be employed in the pan 30 to control the flow of molten solder within the pan. As indicated, solder may flow in a direction indicated by the arrows 38 in the region beneath the separator 36 with the solder then reversing its flow direction as indicated by the arrows 40 in the region above the separator. The flow direction 40, as indicated, may generally coincide with the direction of movement of the belt 32.

The circuit boards are contacted on their upper surface by the belt 32 as the circuit boards move through the solder station 28. As the circuit boards enter the molten solder within the pan 30, solder which is displaced by the volume of the circuit boards exerts a buoyant upward force against the boards which holds the boards in contact with the belt 32. Thus, the support for the circuit boards as they pass through the solder station 28 is provided by the buoyant upward force of the molten solder against the boards. In maintaining contact between the belt 32 and the boards within the pan 30, the speed of the belt may be regulated. Also, the speed and direction of movement of the molten solder within the pan 30 may be regulated to maintain contact between the circuit boards and the belt 32.

The flow of solder in direction 40, as indicated, assists in maintaining contact between the circuit boards and the belt 32. As will be described, the molten solder may be pumped to provide a desired flow direction and flow speed within the pan 30. Also, however, the movement of belt 32 itself in passing through the molten solder within the pan 30 tends to generate a flow of molten solder with the solder in proximity to the belt moving in the same direction as the belt. Depending upon the size of the circuit boards passing through the solder station 28, the density of the boards and the speed of movement of the belt 32, the movement of the molten solder within the pan 30 may, thus, be provided simply by the movement of the belt 32.

A weir 42 may be formed at one end of the separator 36 with molten solder flowing over the weir. A circuit board 44 may ride on the crest of the solder flowing over the weir 42 such that the board is supported by an upward buoyant force as the board leaves the soldering station 28.

After passing through the soldering station 28, the circuit boards, as indicated by circuit board 44, may enter a solder removal station 45. A conveyor generally indicated as 46 may transport the board 44 past a suction chamber 48 where a negative pressure is applied against the underside of the board such that the board tends to remain in place on the conveyor. A suction chamber 50 may also be positioned above the board 44 while an air knife 52 directs a thin band of compressed air against the upper surface of the board. Air which is discharged through the air knife 52 may be heated by a heater 53 so that the discharged air has an elevated temperature such as about 350° F. On leaving the solder station 28, the board 44 may have a temperature such as 450° F., plus or minus 50°. It is, therefore, desirable that air discharged against the circuit board 44 by the air knife 52 be heated to prevent thermal shock of the solder coating on the board.

Only the copper-coated tracks and holes of the circuit board are to be soldered. Solder which adheres to other portions of the board may, therefore, be dislodged by compressed air directed against the board by the air knife 52. The solder which is removed from the circuit board may pass into the suction chambers 48 and 50 for subsequent recovery in any convenient manner, such as by use of a screen. A blower 54 may be used to generate a reduced pressure for the suction chamber 50, as indicated.

After passing the air knife 52, the circuit boards, as indicated by circuit board 44, may be contacted by a conveyor 55 which contacts the upper surface of the boards. As will be described, the conveyors 46 and 55 may be specially constructed to reduce frictional contact between the conveyor surfaces and the circuit boards. This is desirable to minimize removal of solder from the circuit boards by frictional contact with the conveyor surfaces.

While the upper surface of a circuit board is contacted by the conveyor 55, a suction chamber 56 positioned adjacent the upper surface of the board may impose a negative pressure pressure against the upper surface to hold the board in contact with the conveyor 55. A suction chamber 58, of a smaller size than the suction chamber 56, may be positioned adjacent to the under surface of the board while an air knife 60 directs a thin stream of compressed air against the under surface of the board. Air which is discharged by the air knife 60 may be heated within a heater 61 while a blower 62 draws air from the suction chambers 48 and 58. As indicated, the blower 54 may draw air from the two suction chambers 50 and 56. Solder which is removed from the circuit boards by the air knives 52 and 60 may, thus, be drawn into the suction chambers 50, 56, 48, and 58.

After leaving the soldering station 45, the circuit boards, such as circuit board 44, may enter an air cooling station 64. In passing through air cooling station 64, the circuit boards may be transported on a conveyor 66 through a chamber 68. Air may be drawn across the circuit boards within the chamber 68 with the air being discharged by a plurality of fans 70. To coordinate the speed of the belt 32 and the speed of the conveyors 46, 55, and 66, all may be driven by a common source such as a motor 72 through a common drive train indicated schematically as 74, or by individual synchronized motors.

After leaving the air cooling station 64, the circuit boards may be transported to a water scrub station 76 where the boards may pass between a plurality of drive rolls 78. Rotatable brushes 80 may be positioned to contact the circuit boards while water is discharged against the boards through conduits 82 and then conducted away through a drain 84. Following this, the boards may be conducted to a drying station 86 which includes a conveyor 88 that passes between air conduits 90 where air is discharged against the boards to dry them.

FIG. 2 is an enlarged perspective view of a portion of the conveyor 46 to illustrate the manner in which circuit boards may be conveyed while minimizing frictional contact of the conveyor with the boards. The conveyor 46 is typical also of the conveyors 55 and 66. As illustrated, the conveyor 46 may be formed from a plurality of wires 92 which are kinked as indicated at 94 to define open meshes 96. A plurality of clips such as clip 98 may be connected to the wires 92. The clips 98 may include a base portion 100 that is joined to adjacent wires 92 in any convenient manner while spring ears 102 project away from the base portion and are defined by slits 104 between the spring ears and the base portion. Contact points 106 may be defined at the extremities of the spring ears 102 with the contact points functioning to support a circuit board in contact therewith while minimizing frictional contact with the circuit board. The spring ears 102 may be inclined in the direction of movement of the conveyor 46 to position the contact points 106 pointing in the direction of movement of the conveyor to contact and support the circuit board.

FIG. 3 is an enlarged view of the solder station 28 as shown in longitudinal section in FIG. 1. As indicated, the belt 32 may pass over rolls 108 and 110 with the belt preferably being formed in the same general manner with or without spring ears as conveyor 46 described in FIG. 2. A plurality of heaters, one being shown as 112, may be positioned along the bottom of the pan 30 to continuously heat molten solder within the pan. The molten solder may be withdrawn from the pan 30 through an outlet 114 for pumping and then returned through an inlet header 116. A separator plate 118 may join the separator 36 to the balance of the pan 30 such that solder must pass through the pump in flowing from the region below the separator to the region above the separator.

FIG. 4 is a section taken along the line 4—4 of FIG. 3 to illustrate the manner in which the molten solder may be pumped. As indicated, the separator 36 may be joined to side walls 120 and 122 with the roll 110 being rotatably mounted between the side walls. Molten solder may then be withdrawn through the outlet 114 into a pumping chamber 124 for transmission to a pump 126. The pump 126 may include an inlet 128, a drive member 130, an impeller 132 and a discharbe opening 134. After passing through pump 126, molten solder may then flow through the discharge opening 134 into a passage 136 within the inlet header 116. The header 116 may include a plurality of openings from the passage 136 to distribute the molten solder uniformly across the region above the separator 136 as the solder leaves the inlet header. The uniform flow of molten solder from the inlet header 116 is depicted by the arrows 138.

FIG. 5 is a sectional view taken along the line 5—5 of FIG. 3 to demonstrate the overflow of the molten solder as solder passes over the weir 42. As indicated, solder may pass over the weir 42 with the solder overflow being indicated by arrows 140. After flowing over the weir 42, dross from the molten solder may float on the surface of the solder within the region below the separator 36. When the level of dross within the pan 30 is sufficiently high, the dross may be withdrawn through dross overflow lines 142, as indicated, for flow into a collection tank 144.

FIG. 6 is an enlarged sectional view of the downstream end of the soldering station 28 indicating the manner in which the circuit board 44 may be supported as it is removed from the pan 30. FIG. 6 also presents an enlarged view of the solder removal station 45 in which excess solder is removed from the circuit boards by directing a thin stream of compressed air against the circuit boards. The weir 42 includes a lip 146. As molten solder flows over the lip 146, a region of bright metal 148 is formed that is relatively free of dross. Thus, as the circuit board 44 leaves the pan 30, the circuit board may pass through the region of bright metal 148 to produce a cleaner solder coating on the surface of the board. Additionally, the cresting of the molten solder as it flows over the lip 146 provides a buoyant supporting force against the under surface of the circuit board 44 as the board leaves the pan 30.

After passing to the solder removal station 45, the circuit board 44 is subjected to a suction force 150 by the suction chamber 48 which assists in holding the board in contact with the conveyor 46. After passage of the board 44 to the conveyor 55, the board is subjected to an even larger suction force 152 by the suction chamber 56. The suction force 152 assists in supporting the circuit board 44 with the upper surface of the board in contact with the conveyor 55 as compressed air is directed against the under surface of the board by the air knife 60.

An alternative embodiment 45' for a solder removal station is illustrated in a partially sectioned elevational view in FIG. 7. As indicated, a driver generally indicated as 154 may include outwardly extending members 156. The members 156 may be mounted tangentially on a cylindrical support surface 158 with contact points 160 being defined at the ends of the outwardly extending members. As indicated, the contact points 160 may function to both support and to propel the circuit board 44 to the right as indicated in FIG. 7 with the driver 154 being rotated in a clockwise direction.

A similar driver 1162 having outwardly extending members 164 tangentially mounted on a cylindrical support surface 166 with contact points 168 at the ends of the outwardly extending members may be mounted to the right of driver 154 as indicated in FIG. 7. As the driver 162 is rotated in a counterclockwise direction, the contact points 168 are brought into contact with the upper surface of the circuit board 44. In this manner, the driver 162 propels the circuit board 44 to the right, from its position as shown in FIG. 7.

As indicated, the drivers 154 and 162 are positioned to support the circuit board 44 as it moves from the pan 30 to the conveyor 66. Thus, as the circuit board 44 is contacted by the drivers 154 and 162, the board may also be supported by the buoyant force of the molten solder within the pan 30 at the rearward edge of the board. Then, as the circuit board 44 moves further to the right, its forward edge may be supported by the conveyor 66 as well as the drivers 154 and 162. As the board moves still further to the right, enough of the board may be supported by the conveyor 66 to maintain support of the board as it is contacted by the driver 162.

As indicated in FIG. 7, a shield 170 may be positioned between the air knives 52 and 60, and the soldering station 28. The shield 170 may function to prevent solder which is blown from the circuit boards from falling onto the newly-soldered surfaces of the boards. The shield 170 may form a ledge 172 that extends in a generally horizontal direction to catch solder which is blown from a circuit board, such as circuit board 44. A screw conveyor 174 or other solder removal means may be positioned adjacent to the ledge 172 to remove solder from the ledge. A bin or other receptacle (not shown) may be positioned relative to the air knives 52 and 60 and the ledge 172 and conveyor 174 to receive solder which is blown off the circuit boards at the solder removal station.

FIG. 8 is an elevational view, similar to FIG. 7, which illustrates the solder removal station 45' after the circuit board 44 has moved to the right from its position in FIG. 7. As described previously, the circuit board 44 is supported at all times as it passes by the air knives 52 and 60 by the relative positioning of the drivers 154 and 162, the conveyor 66, and the pan 30.

We claim:

1. A multiple station apparatus for applying a protective coating of solder over the conductive portions of a printed circuit board wherein the conductive portions are present on one or both sides of the board comprising:
   a preheat station for receiving the circuit board to be coated;
   a soldering station positioned to receive circuit boards from said preheating station for applying the protective coating of solder;
   said soldering station including means to contain a bath of molten solder;
   means defining a path of travel through said bath of molten solder, which path of travel includes a portion beneath the surface of said bath;
   means positioned above said bath of solder to contact the upper surface of a printed circuit board as the latter travels along said path of travel through said bath of molten solder;
   said last named means cooperating with said bath of solder to form an infeed nip receiving the circuit board from said preheat station as the latter enters said path of travel such that the path of solder urges the printed circuit board into contact with said means which contact the upper surface of the printed circuit board,
   means to move said contact means and circuit board in contact therewith along said path of travel and the portion thereof beneath the surface of said bath as the molten solder exerts an upward force against the circuit board to maintain the latter in contact with said contact means, and
   means cooperating with said soldering station to receive a circuit board therefrom to remove excess solder from the circuit board.

2. The apparatus of claim 1 including means to produce a flow of molten solder within said path of travel which moves in the same general direction as the movement of said contact means and circuit board as the circuit board moves through and beneath the surface of said bath.

3. The apparatus of claim 1 including means to collect solder which is removed from said circuit board.

4. The apparatus of claim 1 wherein the means to remove excess solder from the circuit board includes air knife means directing a band of compressed heated air against the surface of said circuit board.

5. The apparatus of claim 1 wherein said path of travel is defined by spaced apart members, and said contact means travelling between said members.

6. The apparatus of claim 5 wherein said solder flows between said spaced apart members and in a direction generally the same as the direction of travel of said contact member.

7. The apparatus of claim 1 further including means to apply a flux to the circuit board prior to passage of the board through said path of travel through said solder bath.

8. The apparatus of claim 1 further including a speed change conveyor means positioned between the preheat station and the bath of molder solder to increase the rate of speed at which a board travels as it leaves the pre-heat station.

9. The apparatus of claim 1 wherein each of said spaced apart members is arcuate in configuration to define an arcuate path of travel through the bath of solder, and wherein at least the lowest region of said arcuate path is below the surface of the solder bath.

10. The apparatus of claim 9 wherein said contact means travels in contact with that one of said spaced apart members which forms the upper of the two said members.

11. Apparatus for applying a protective coating over the conductive portions of a printed circuit board comprising;
   a precoat station receiving circuit boards and applying a precoating to at least one surface thereof;
   a preheat station positioned to receive a circuit board from said precoat station for heating the board to a predetermined temperature;
   means forming a bath of protective coating material and receiving the boards from the preheat station;
   an upper and lower spaced apart member defining an arcuate path of travel into and beneath the surface of said bath and out of said bath;
   endless belt means having a path of travel such that a portion thereof passes between said spaced members;
   said belt means being spaced from said lower member and in contact with said upper member such that the portion of the belt in contact with said upper member travels in an arcuate path;
   means to feed circuit boards into the space between said upper member and said belt such that one surface of the board contacts said endless belt while the other surface is spaced from said lower member and the protective coating material beneath the board operates as an upward buoyant force urging the board in contact with said belt;
   means to advance said belt along said path of travel to carry circuit boards in contact with said belt along said arcuate path and below the surface of said protective coating material whereby protective coating material deposits on at least the portions on one or both surfaces; and
   means to remove the protective coating material deposited other than on the conductive portions on one or both surfaces of the circuit board.

12. The apparatus of claim 11 wherein said means to remove the protective coating material includes at least one air knife means positioned transversely of said path of travel.

13. The apparatus of claim 12 further including means to heat the air prior to flow thereof into said air knife means.

14. The apparatus of claim 11 wherein said spaced apart members include a weir at the outlet end thereof and defining a zone of bright solder metal which contacts the printed circuit board as it exits from said spaced apart members.

15. The apparatus of claim 14 wherein said means to remove the protective coating material is positioned transversely of the path of travel and includes air knife menas to remove the protective coating material deposited other than on the conductive portions on one or both surfaces of the circuit board after the circuit board exits from the weir of said spaced apart members.

* * * * *